(12) United States Patent
Kimura et al.

(10) Patent No.: US 6,169,672 B1
(45) Date of Patent: Jan. 2, 2001

(54) POWER CONVERTER WITH CLAMPING CIRCUIT

(75) Inventors: Shin Kimura; Tsutomu Yatsuo; Takayuki Iwasaki, all of Hitachi (JP)

(73) Assignee: Hitachi, Ltd., Tokyo (JP)

(*) Notice: Under 35 U.S.C. 154(b), the term of this patent shall be extended for 0 days.

(21) Appl. No.: 09/202,924

(22) PCT Filed: Jul. 3, 1996

(86) PCT No.: PCT/JP96/01838

§ 371 Date: Dec. 23, 1998

§ 102(e) Date: Dec. 23, 1998

(87) PCT Pub. No.: WO98/01939

PCT Pub. Date: Jan. 15, 1998

(51) Int. Cl.$^7$ ............................................... H02H 7/122
(52) U.S. Cl. ..................................... 363/56; 361/91.8
(58) Field of Search ................................ 363/27, 56, 57, 363/58; 361/91.7, 91.6, 91.5, 91.8

(56) References Cited

U.S. PATENT DOCUMENTS

| | | | |
|---|---|---|---|
| 4,282,555 | * 8/1981 | Svedberg | 361/56 |
| 4,554,487 | * 11/1985 | Nilssen | 315/224 |
| 4,600,411 | * 7/1986 | Santamaria | 363/27 |
| 4,885,657 | * 12/1989 | Gruning | 361/91 |
| 4,926,306 | * 5/1990 | Ueda et al. | 363/58 |
| 4,980,303 | * 12/1990 | Yamauchi | 437/31 |
| 5,892,675 | * 4/1999 | Yatsu et al. | 363/136 |

* cited by examiner

*Primary Examiner*—Peter S. Wong
*Assistant Examiner*—Gary L. Laxton
(74) *Attorney, Agent, or Firm*—Antonelli, Terry Stout & Kraus, LLP

(57) ABSTRACT

A power converting apparatus comprising a group of semiconductor switches and DC terminals electrically connected to the group of semiconductor switches, in which a clamping circuit is connected to the semiconductor switches or the DC terminals. Otherwise, a diode having a wide band gap is connected in parallel with a snubber diode or a snubber capacitor of a snubber circuit connected in parallel with the semiconductor switches. With such arrangement, an overvoltage or oscillating voltage impressed on the semiconductor switches is suppressed.

18 Claims, 7 Drawing Sheets

POWER CONVERTER WITH CLAMPING CIRCUIT

BACKGROUND OF THE INVENTION

The present invention relates to a power converting apparatus using semiconductor devices.

While development of semiconductor switching devices having a higher withstand voltage and supplying a large current has been desired in order to meet the demands for power converting apparatuses of smaller size and with higher efficiency in recent years, there have been developed such large capacity devices as insulated-gate bipolar transistors (hereinafter briefly called IGBT) of a 3.3 kV–1.2 kA class and gate turn-off thyristors (hereinafter briefly called GTO) of a 6 kV–6 kA class.

FIG. 5 shows a conventional single-phase inverter using GTOs as semiconductor switches. This inverter supplies a load 10 with AC power converted from a DC power source 1 by alternately turning on-off the GTOs (41, 42, 43, 44). Upon turning off of the GTOs at this time, energy stored in wiring inductance 2 and anode reactors (31, 32, 33, 34) are changed into an overvoltage impressed on the GTOS. Therefore, there are generally provided snubber circuits for suppressing the overvoltage. Referring to FIG. 5, snubber diodes (71, 72, 73, 74) and snubber capacitors (91, 92, 93, 94) are connected in series with the anode reactors (31, 32, 33, 34) and energy recovery circuits (121, 122, 123, 124) for the snubber capacitors (91, 92, 93, 94), through diodes (111, 112, 113, 114), respectively. Accordingly, waveforms at the time of turn-off of the GTOs become as shown in FIG. 6.

Concerning the maximum output of such an inverter, the maximum cutoff current while it is in rated operation is determined by such factors as the current supply condition and the loss characteristic cooling characteristic of the device or the like, whereas the maximum cutoff current when fault protection is made is determined within the range of the rated controllable current of the device.

On the other hand, concerning the voltages, the snubber circuit is arranged and the power source voltage are determined so that the transient overshoot voltage occurring at the time when the current is cut off upon occurrence of a fault may not exceed the rated withstand voltage of the device. Therefore, it is the practice today to lower the power source voltage close to half the withstand voltage of the device.

Under these circumstances, there is a method for suppressing an overvoltage, in an arrangement of a snubber circuit, which is formed of a snubber diode, a snubber capacitor, and a snubber resistor, connected in parallel with the main switching device, by connecting a voltage regulating diode in parallel with the snubber capacitor (Japanese Patent Laid-open No. Hei 7-143733).

In FIG. 8, there is shown an example of a relationship between a withstand voltage and operating loss of a semiconductor device. When the withstand voltage of a device is increased, it becomes necessary to increase the thickness of the semiconductor wafer and, hence, the on-time voltage increases. Therefore, the on-time steady loss increases in direct proportion to the withstand voltage. Meanwhile, since both the operating voltage and the tail current at the time of turn-off (refer to FIG. 6) increase, the switching loss increases virtually in direct proportion to the square of the withstand voltage. While the relative magnitude of the switching loss and the on steady-state loss varies with the current supply condition, providing the device with a higher withstand voltage is accompanied by an increase in the device area and in the package size, an increase in cooling power, and so on, in order that increase in such losses is prevented and cooling of the device is facilitated.

However, since, in the above described prior art, the transient overshoot voltage, occurring at the time when a fault is protected, is great, it is inevitable to lower the power source voltage of the device to a level close to half the withstand voltage, which was raised with much effort. For this reason, even though the converting apparatus is made larger in size, only a relatively small converted power could be obtained.

Further, when a snubber circuit is provided for suppressing the overshoot voltage, it is always accompanied by generation of a line inductance (81, 82, 83, 84). The energy stored therein is eventually consumed by the GTO (41, 42, 43, 44) as the main switching device, a flywheel diode (51, 52, 53, 54), and the snubber diode (71, 72, 73, 74). Further, the current flowing at this time produces resonation between the inductance (81, 82, 83, 84) of the snubber wiring and the parasitic capacitance of the snubber diode (71, 72, 73, 74) or the snubber capacitor (91, 92, 93, 94), which impresses an excessive voltage on the GTO (41, 42, 43, 44) and the snubber diode (71, 72, 73, 74), invites an increase in the device loss, and causes breakdown of the device.

It is an object of the invention to suppress the overvoltage and oscillating voltage that are impressed on semiconductor devices used in a power converting apparatus to thereby make the power converting apparatus provide a higher output and operate with a higher reliability.

DISCLOSURE OF INVENTION

The power converting apparatus of the present invention comprises a group of semiconductor switches including at least one semiconductor switch. The group of semiconductor switches are connected to a pair of DC terminals having a DC potential. The DC terminals correspond, for example, to the junctions of a DC power supply with the main circuit of the power converting apparatus. Further, across the semiconductor switch, or between the DC terminals, of the power converting apparatus according to the invention, a clamping circuit is connected in parallel. By means of the clamping circuit, the voltage impressed on the semiconductor switch is clamped at a voltage higher than the voltage between the DC terminals and lower than the withstand voltage of the semiconductor switch.

According to the invention, even if the semiconductor switch turns off a larger current than in a rated operation at the time when failure protection of the power converting apparatus is made, the overshoot voltage to be impressed on the semiconductor switch is clamped at a voltage value lower than the withstand voltage of the semiconductor switch. Therefore, the withstand voltage of the semiconductor switch can be lowered and, hence, the loss in the semiconductor switch can be reduced. Further, the power source voltage for the power converting apparatus can be raised. Therefore, a power converting apparatus with a higher efficiency and the capability of a higher power output can be realized.

The power converting apparatus according to the invention comprises, besides the semiconductor switch, a snubber circuit connected in parallel therewith. The snubber circuit is provided for suppressing the dV/dt of the voltage impressed on the semiconductor switch to thereby protect the semiconductor switch from an overvoltage. The snubber circuit in the power converting apparatus according to the invention has a circuit consisting of a diode and a capacitor connected in series. Further, the diode or the capacitor in the snubber circuit, i.e., the snubber diode or the snubber capacitor, is provided with a diode, connected in parallel therewith, having a semiconductor substrate whose band gap is wider than that of silicon.

The diode having a semiconductor substrate with a band gap wider than silicon can be made smaller in size than a diode having whose semiconductor substrate is made of silicon and, therefore, the diode, when connected to the snubber circuit, does not increase the wiring inductance. Accordingly, the electromagnetic energy stored in the snubber circuit does not increase and, in addition, the energy is consumed by this diode. Therefore, any voltage and current oscillation occurring in the snubber circuit can be suppressed.

BEST MODE FOR CARRYING OUT THE INVENTION

Figure 1:
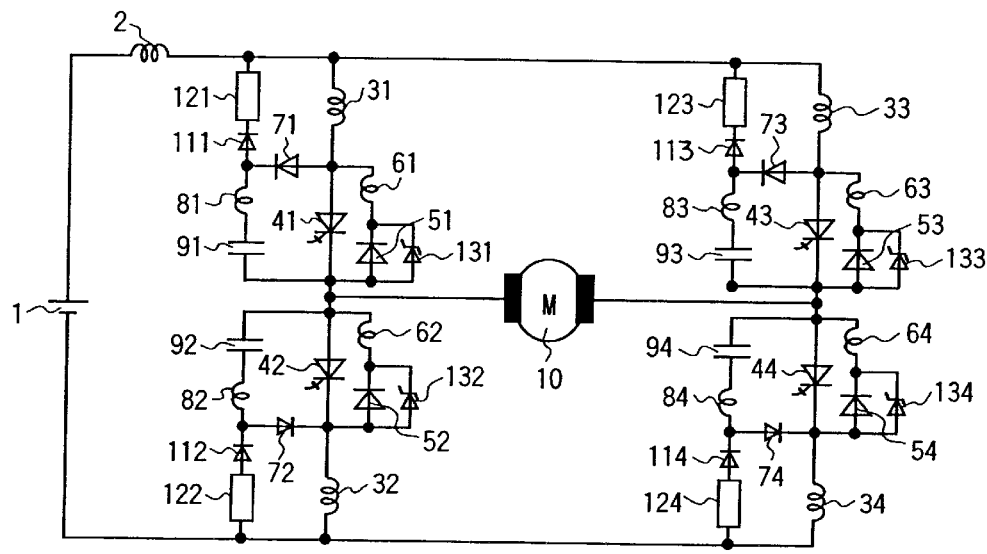
FIG. 1 is a schematic circuit diagram of a single-phase inverter representing an embodiment of the invention.
Figure 5:
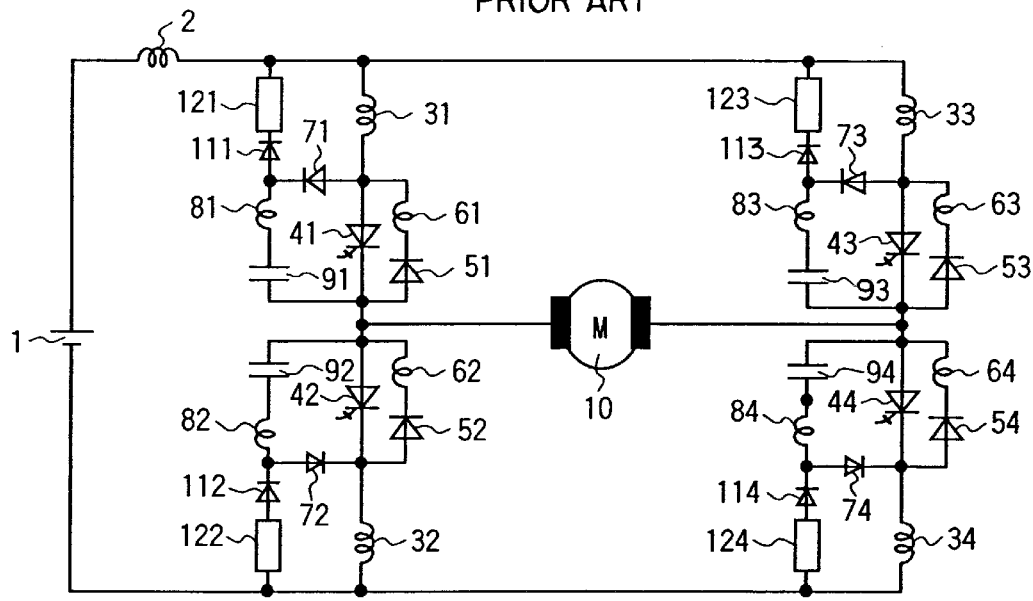
FIG. 5 is a schematic circuit diagram of a conventional single-phase inverter.
Figure 6:
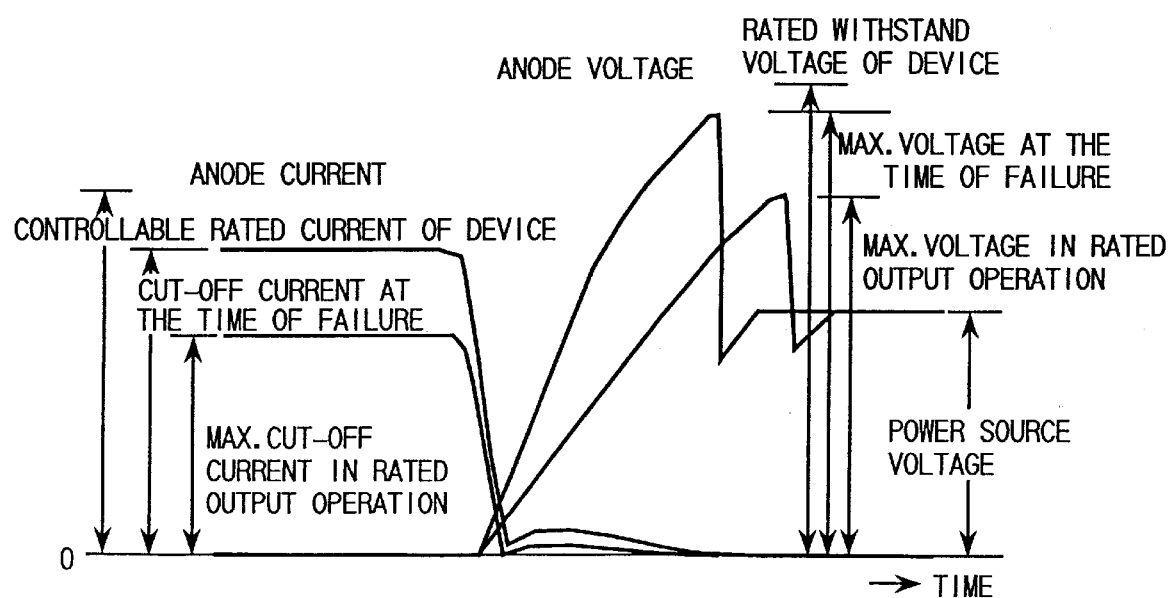
FIG. 6 is a diagram of current and voltage waveforms at the time of turn-off of the conventional single-phase inverter.

FIG. 1 shows a single-phase inverter representing an embodiment of the invention. Components therein like those in the conventional single-phase inverter shown in FIG. 5 are denoted by corresponding reference numerals. Referring to FIG. 1, reference numeral 1 denotes a DC power source, 2 denotes the wiring inductance of the main circuit, 31 to 34 denote anode reactors, 41 to 44 denote GTOs used as the main switches, 51 to 54 denote flywheel diodes, 61 to 64 denote wiring the inductances of the diodes, 71 to 74 denote snubber diodes, 81 to 84 denote the wiring inductances of the snubber circuits, 91 to 94 denote snubber capacitors, 10 denotes a motor operating as the load, 111 to 114 denote diodes, 121 to 124 denote recovery circuits for the snubber energy, and 131 to 134 denote avalanche diodes operating as clamping circuits.

The single-phase inverter supplies power from the DC power source 1 to the load 10, for example, by turning on the main switches GTOs 41 and 44, through the path of the DC power source 1 wiring inductance 2—anode reactor 31—GTO 41—load 10 GTO 44—anode reactor 34. If the GTO is turned off in this state, the current flowing through that path now flows through the path of the snubber diode 71—snubber wiring inductance 81—snubber capacitor 91, and the power supply from the DC power source 1 is stopped on account of the voltage charged on the snubber capacitor 91 becoming higher than the voltage of the DC power source 1. Meanwhile, the current flowing through the load 10 continues flowing, owing to the energy stored in the load 10, through the path of the GTO 44—anode reactor 34 anode reactor 32—flywheel diode 52. During the operation of turn-off, the energy stored in the anode reactor 31 is recovered, through the diodes 71 and 111, by the recovery circuit 121, and the energy stored in the wiring inductance 2 of the main circuit is stored in the snubber capacitor 91. Therefore, an overshoot voltage higher than the voltage of the DC power source 1 is impressed on the GTO 41.

Figure 2:
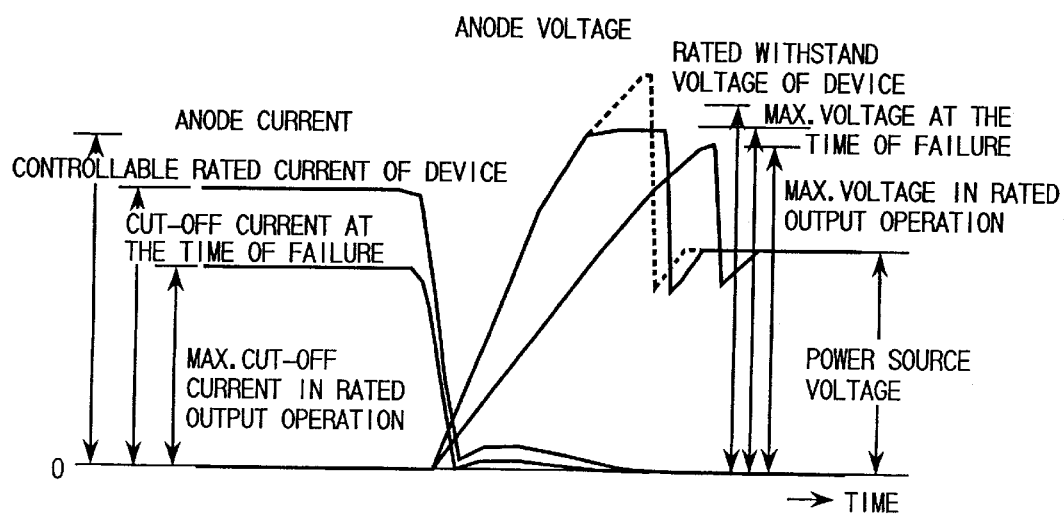
FIG. 2 is a diagram of waveforms at the time of turn-off of the GTO.

FIG. 2 is a diagram showing waveforms of the anode current and the anode voltage at the time when the GTO 41 turns off. When the GTO 41 turns off, because the energy stored in the wiring inductance 2 of the main circuit shifts to the snubber capacitor 91, the anode voltage first overshoots to a level higher than the power source voltage. This overshoot voltage, when the shifting of the energy is ended, comes to be impressed on the snubber diode 71 as a backward voltage. Therefore, the anode voltage of the GTO 41 returns to the level of the power source voltage.

When the GTO 41 is turned on again, the energy stored in the snubber capacitor 91, in normal cases, is recovered by the recovery circuit 121 through the path of the diode 111—recovery circuit 121—anode reactor 31 GTO 41. However, in the case of an overcharge, the energy is recovered by the recovery circuit 121 and the DC power source 1 through the path of the diode 111—recovery circuit 121—main circuit wiring inductance 2—DC power source 1—anode reactor 32—flywheel diode 52.

The breakdown voltage of the avalanche diodes (131 to 134) operating as the clamping circuit in the present embodiment is so set that the voltage may not be clamped as long as the voltage is below the level around the highest overshoot voltage to be generated while the inverter is in a rated output operation and, therefore, the operation waveform exhibits virtually no change while the rated output operation is being made. Conventionally, when a current, which is greater than the current that flows while the inverter is operating with a rated output, is cut off in the event of an overload operation for a short period of time or due to a short circuiting of the load 10, an extreme overshoot voltage is generated, as indicated by the broken line in FIG. 2. In the present embodiment, however, the current then flowing through the snubber diode 71 snubber wiring inductance 81—snubber capacitor 91 is caused to flow through the avalanche diode 131, whereby the voltage impressed on the GTO 41 is clamped at the breakdown voltage of the avalanche diode 131. Accordingly, the rated withstand voltage of the GTO 41 is only required to be slightly higher than that voltage and, therefore, the rated withstand voltage of the GTO 41 can be greatly lowered. Hence, an increase in the loss, an increase in the package size, and an increase of the cooling capacity accompanying the increase in the withstand voltage of the device can be avoided. Conversely speaking, while using GTOs (41 to 44) with the same withstand voltage, it becomes possible to raise the voltage of the DC power source 1 and greatly increase the inverter output.

Although the withstand voltage of the GTO in the conventional inverter apparatus is set, in consideration of the protection of the device in the event of a failure, to be approximately two times as large as the power source voltage, the maximum overshoot voltage generated while operating at rated output is around less than ⅔ of the withstand voltage of the GTO. According to the present embodiment, since the breakdown voltage of the avalanche diodes (131 to 134) is so set that a clamping operation may not occur during the period of rated output operation, the withstand voltage of the GTOs can be lowered to a level approximately ⅘ times (1.33 times) as high as the power source voltage. However, the clamping voltage of the overshoot voltage, i.e., the breakdown voltage of the avalanche diodes (131 to 134) should not be over the withstand voltage of the GTOS. Therefore, the withstand voltage of the GTOs is set to be larger than the breakdown voltage of the avalanche diodes (131 to 134). According to the examination carried out by us, it is preferred that the withstand voltage of the GTO should be around 1.5 times as high as the power source voltage. Further, the avalanche diode in the present embodiment operates infrequently and produces little loss during the period of rated output operation.

Further, in the present embodiment, if the breakdown voltage of the avalanche diodes (131 to 134) is set at a level between around 90% of the maximum overshoot voltage during the period of rated output operation and two times the power source voltage, the withstand voltage of the GTOs can be set lower than before (namely, two times the power source voltage or thereabout) while having little loss produced in the avalanche diode. Further, when there is no problem with the loss in the avalanche diode, the breakdown voltage of the avalanche diode may be set between the power source voltage and the maximum overshoot voltage during the period of rated output operation.

The avalanche diode in the present embodiment uses, as a substrate, a semiconductor material having a wider band gap characteristic than that of silicon. For example, an avalanche diode using silicon carbide has an excellent temperature characteristic of 700° C. as against that of about 150° C. in the case where silicon is used. Consequently, supposing that the maximum temperature of the cooling fin for a power converting apparatus in operation is 80° C., the range of operating temperature in the case where silicon is used is 70° C. On the other hand, the range of operating temperature where silicon carbide is used is expanded to 630° C., nine times as wide as that where silicon is used. Accordingly, the chip area of the avalanche diodes (131 to 134) can be made smaller than approximately 1/10 of that of the flywheel diodes (151 to 154). The maximum outer dimension in the direction of the chip surface of the avalanche diodes (131 to 134) with the package included becomes approximately below ½ of that of the flywheel diodes (51 to 54).

Since the avalanche diodes can be made smaller, as described above, it can be attached to the cooling fin of the main switch GTOs (41 to 44) or the flywheel diodes (51 to 54), conjointly therewith. Accordingly, the inverter apparatus can be made smaller. Further, the wiring inductances accompanying the arrangement of the flywheel diodes (51 to 54) can be minimized and, hence, the overshoot voltage caused by the current flowing through the wiring inductances can be lowered.

Concerning the arrangement of the avalanche diodes (131 to 134), they should preferably be arranged adjacent to the flywheel diodes (51 to 54). This is because such an arrangement is advantageous in view of the device loss of the avalanche diodes (131 to 134) as against an arrangement where they are adjacent to the GTOs (51 to 54). That is, referring to FIG. 1, when a current flows through the flywheel diode (51 to 54), the overshoot voltage thereby produced in the wiring inductance (61 to 64) causes a high voltage to be applied between the anode and the cathode of the GTO (41 to 44). Accordingly, if the avalanche diode (131 to 134) is disposed alongside the GTO, the avalanche diode will bear a portion of the current flowing through the flywheel diode (51 to 54) and its device loss will increase. As a result, it becomes necessary to make the avalanche diode (131 to 134) larger and to provide cooling means therefor, and this leads to an increase in the apparatus size and fabrication cost. Such a problem does not arise in this embodiment.

Referring to FIG. 1, since the anode reactors (31 to 34) are connected to the junction of the flywheel diodes (51 to 54) and the wiring inductances (31 to 34), the overshoot voltage generated in the wiring inductances (61 to 64) when currents flow through the flywheel diodes (51 to 54) is suppressed. Therefore, there arises practically no problem whether the avalanche diodes (131 to 134) are connected alongside the GTOs (41 to 44) or alongside the flywheel diodes (51 to 54).

Figure 9:
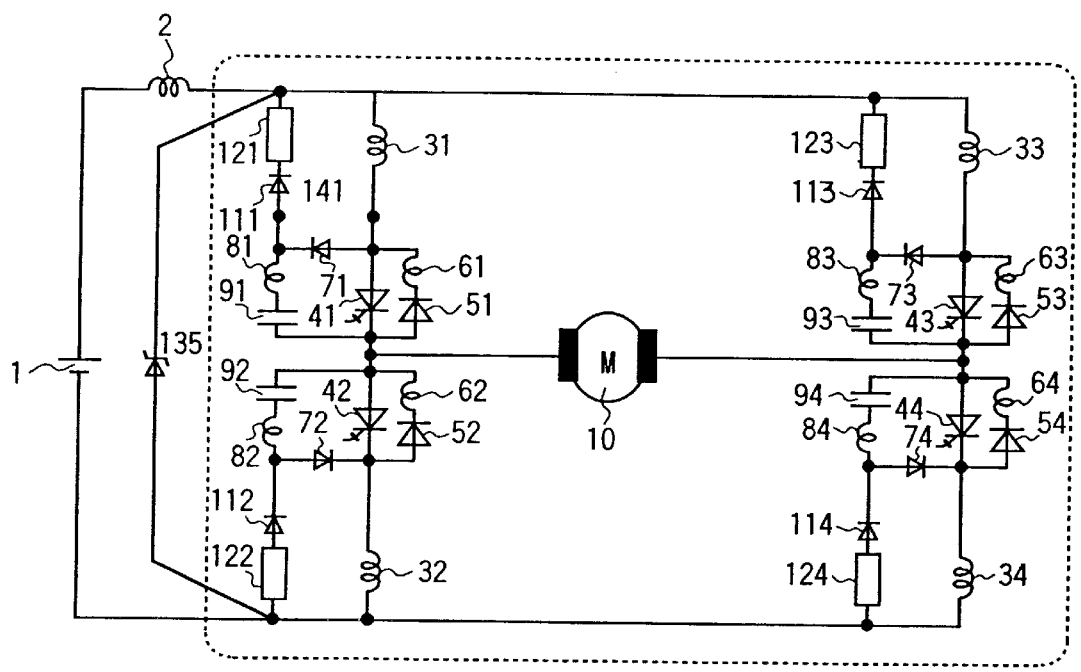
FIG. 9 is a schematic circuit diagram of a single-phase inverter representing another embodiment of the invention.

FIG. 9 shows a power converting apparatus according to another embodiment of the invention. The point in which FIG. 9 differs from FIG. 1 is that an avalanche diode 135 is connected only between the points at which the DC power source 1 is connected to the power converting apparatus through the main circuit wiring inductance 2. Also, by the configuration of this embodiment, the overshoot voltage generated by the energy stored in the wiring inductance 2 can be put down to the level of the breakdown voltage of the avalanche diode 135 and, therefore, the same effect can be obtained as obtained in the previous embodiment.

Figure 10:
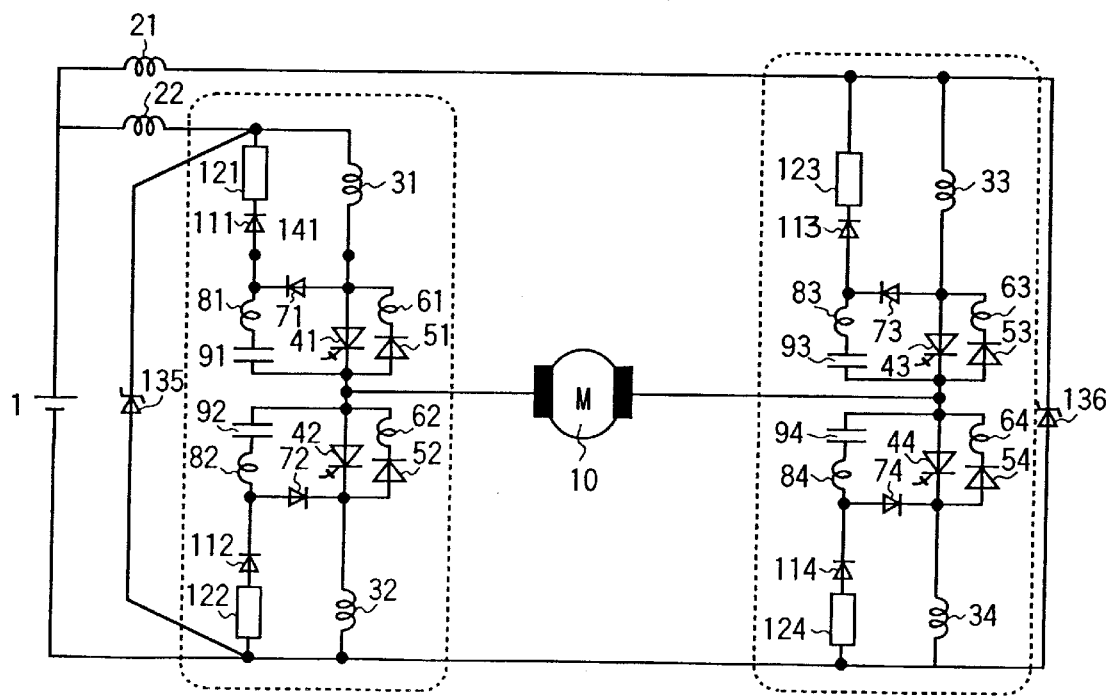
FIG. 10 is a schematic diagram of a single-phase inverter representing another embodiment of the invention.

FIG. 10 shows a power converting apparatus representing a variation of the embodiment of FIG. 9. When a power converting apparatus with a larger capacity is used, it is sometimes the practice to pluralize the main circuit wiring from the DC power source 1 to the converting apparatus. In such case, by connecting avalanche diodes (135, 136) between each pair of the points at which the DC power source 1 is connected, through wiring inductances (21, 22), to the power converting apparatus, the same effect can be obtained as is obtained in the embodiment of FIG. 9.

Figure 11:
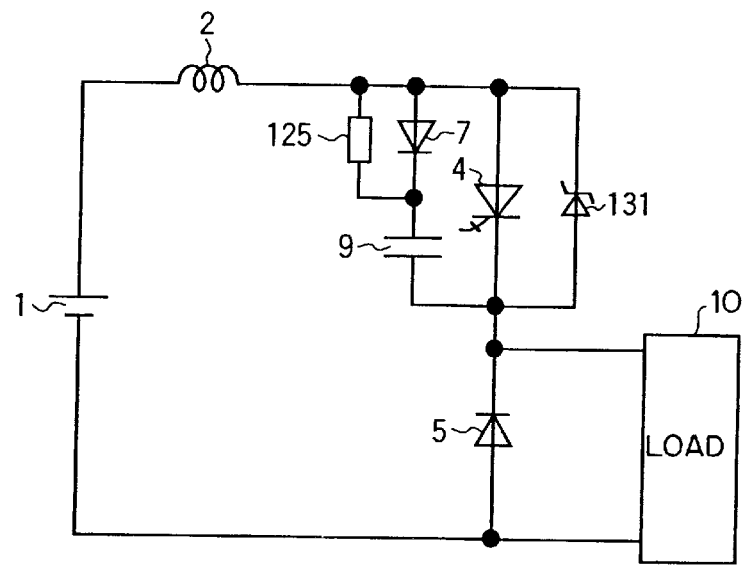
FIG. 11 is a schematic circuit diagram of a chopper circuit according to the invention.

FIG. 11 is a chopper circuit according to the invention. Referring to the drawing, reference numeral 4 denotes a GTO, 5 denotes a flywheel diode, 7 denotes a snubber diode, 9 denotes a snubber capacitor, 125 denotes a snubber resistor, and 131 denotes an avalanche diode. In such a chopper circuit, by turning on the GTO 4, DC power is supplied to the load 10 from the DC power source 1 through the wiring inductance 2. Then, if the GTO 4 is turned off, the snubber capacitor 9 is charged and, when the charged voltage exceeds the voltage of the DC power source 1, the power supply to the load 10 is stopped. Such a series of switching operations of the GTO 4 are the same as in the above described inverter. Therefore, in such a circuit, the same effect can be obtained as is obtained in the above described embodiment by connecting the avalanche diode 131, in a reverse direction, in parallel with the GTO 4.

Figure 12:
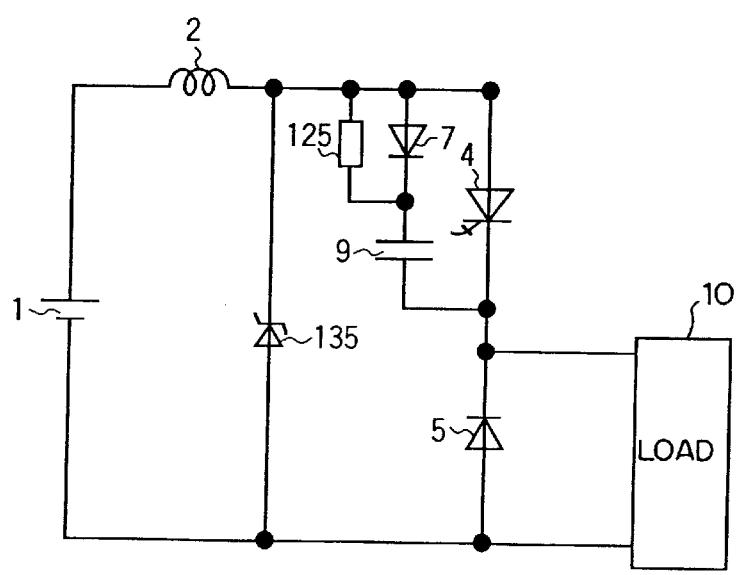
FIG. 12 is a schematic circuit diagram of another chopper circuit according to the invention.

FIG. 12 shows a chopper circuit representing a variation of the embodiment of FIG. 11. The difference from FIG. 11 is in the points to which the avalanche diode 135 as the clamping circuit is connected. Also, in this embodiment, the same effect can be obtained as is obtained in the above described embodiments.

Figure 13:
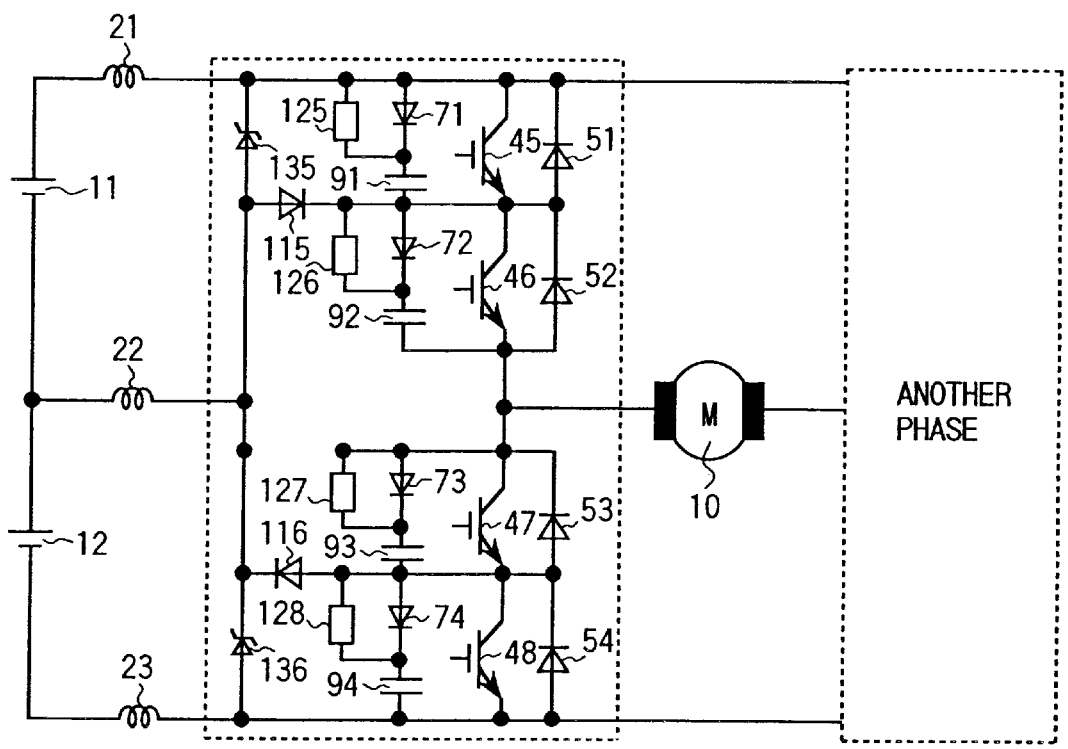
FIG. 13 is a schematic circuit diagram of another chopper circuit according to the invention.

FIG. 13 shows an embodiment of a three-level inverter according to the invention. Referring to the drawing, reference numerals 45 to 48 denote IGBTS, 125 to 128 denote snubber resistors, and 115 and 116 denote clamping diodes. In such a three-level inverter, the same effect can be obtained as is obtained in the above described embodiments by connecting avalanche diodes 135 and 136 in parallel with their respective DC power sources 11 and 12.

Figure 14:
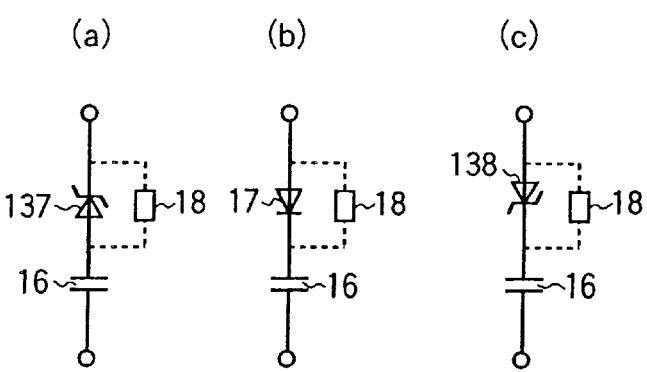
FIGS. 14(*a*), (*b*), and (*c*) are schematic diagrams of clamping circuits according to the invention.

Variations of the clamping circuit according to the invention are shown in FIGS. 14(*a*), 14(*b*) and 14(*c*).

FIG. 14(*a*) shows an example of a clamping circuit made up of an avalanche diode 137 and a capacitor 16. It is different from the above described avalanche diodes (135, 136) in that the breakdown voltage of the avalanche diode 137 can be made lower. Namely, even if the breakdown voltage of the avalanche diode 137 is made lower than the maximum overshoot voltage generated during the period of rated operation of the power converting apparatus, the difference between them is charged on the capacitor 16. Although the capacitor is, then, not charged while the power converting apparatus is in rated operation, the same clamping function as described above is performed against an overvoltage generated when overload operation or protection of overcurrent is made. Therefore, according to the present clamping circuit, the loss in the avalanche diode 137 can be reduced.

What is indicated by the broken line in FIG. 14(*a*) is a discharging circuit 18 for the capacitor 16. The discharging circuit 18 discharges the charge on the capacitor 16 when the capacitor 16 is overcharged during overload operation or overcurrent protection or when the power converting apparatus is stopped. The discharging time constant of the discharging circuit 18 is set to be ten times as large as or above the operating frequency of the power converting apparatus. The clamping circuit, having such a large time constant, does not operate, and hence produces no loss, while the power converting apparatus is in rated operation. Accordingly, not only can the clamping circuit be made smaller, but also the converting efficiency of the power converting apparatus can be kept from decreasing.

FIG. 14(*b*) is an example of a clamping circuit made up of a diode 17 and a capacitor 16. By using such a clamping circuit, the same result can be obtained as obtained by the use of the avalanche diodes (135, 136). Namely, the capacitor 16 is charged up to the power source voltage at the beginning but, when the power converting apparatus starts operating, it is charged up to the maximum overshoot voltage generated in rated operation. Thereafter, it is not charged as long as the power converting apparatus is at rated operation, and the clamping action is performed only when an overvoltage is produced and overload operation or overcurrent protection is effected. Thus, by making it operate only when overload operation or overcurrent protection is effected, the capacitor 16 can be provided by an electrolytic capacitor and hence a smaller clamping circuit can be realized. Incidentally, the discharging circuit 18 for the capacitor 16 indicated by the broken line is for allowing the capacitor 16 to discharge the charge thereon in the same way as in the clamping circuit of FIG. 14(*b*), and a larger time constant than the operating frequency is selected therefor.

FIG. 14(*c*) shows an example provided by exchanging the diode 17 in FIG. 14(*b*) with an avalanche diode 138. The overload operation is generally stopped within a short period of time, but depending on the length of time, the voltage on the capacitor 16 becomes high and therefore it becomes necessary to increase the capacity of the capacitor 16 to suppress the voltage. When the avalanche diode 138 is used, a discharge is produced through the avalanche diode 138 when the difference between the power source voltage and the charged voltage on the capacitor 16 exceeds a predetermined voltage. Namely, the overvoltage occurring at the time when an overload operation or overcurrent protection is effected is absorbed and, thereby, the discharging of the stored charge on the capacitor 16 can be expedited. Therefore, it is not necessary to increase the capacity of the capacitor 16, and a small clamping circuit can be realized.

Figure 3:
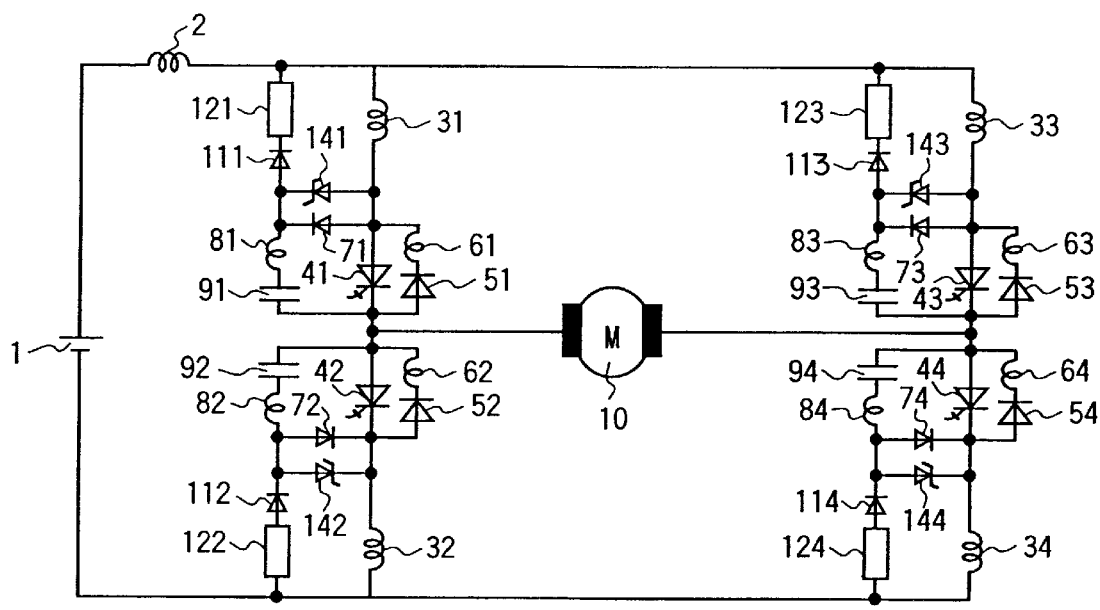
FIG. 3 is a schematic circuit diagram of a snubber circuit according to the invention.
Figure 4:
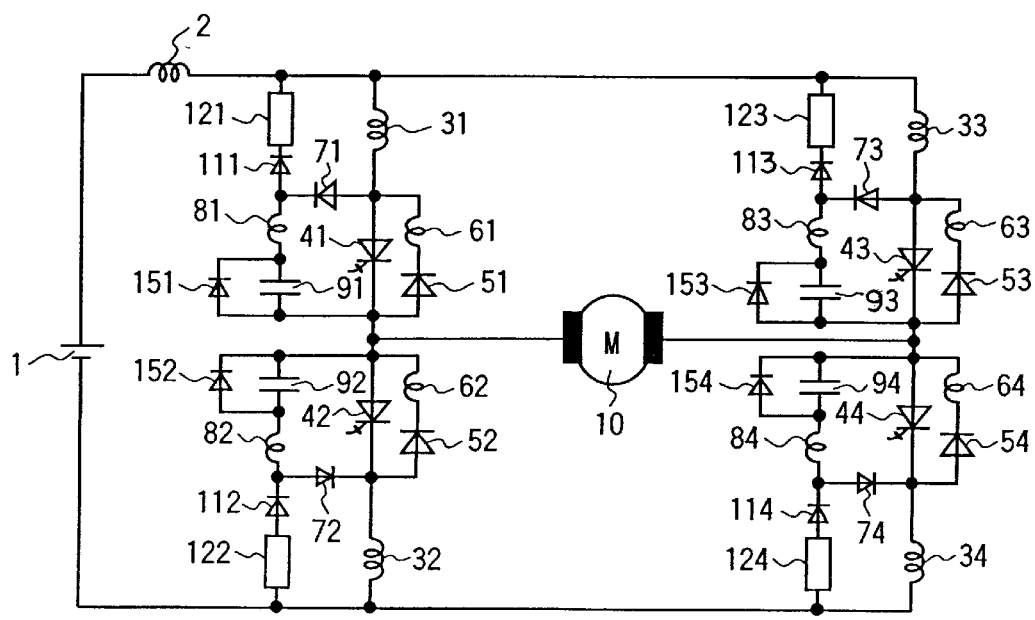
FIG. 4 is a schematic circuit diagram of another snubber circuit according to the invention.

FIG. 3 and FIG. 4 show other embodiments of the invention. In the embodiment of FIG. 3, there are provided snubber diodes (71 to 74) and, in parallel connection therewith, avalanche diodes (141 to 144). The breakdown voltage of the avalanche diodes is lower than the withstand voltage of the snubber diode. In the embodiment of FIG. 4, there are provided diodes (151 to 154) and, in parallel connection therewith, snubber capacitors (91 to 94). By such arrangement, current and voltage oscillation produced in the snubber circuit can be suppressed. The oscillating phenomenon will be described with reference to FIG. 7.

Figure 7:
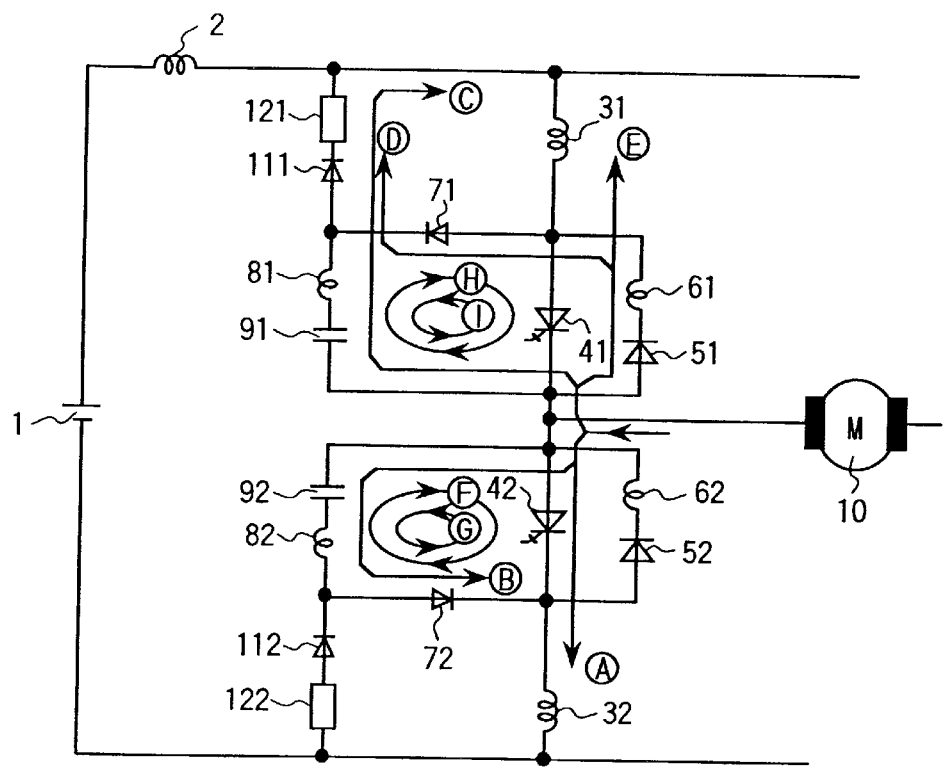
FIG. 7 is a schematic circuit diagram for explaining operations in the snubber circuits.
Figure 8:
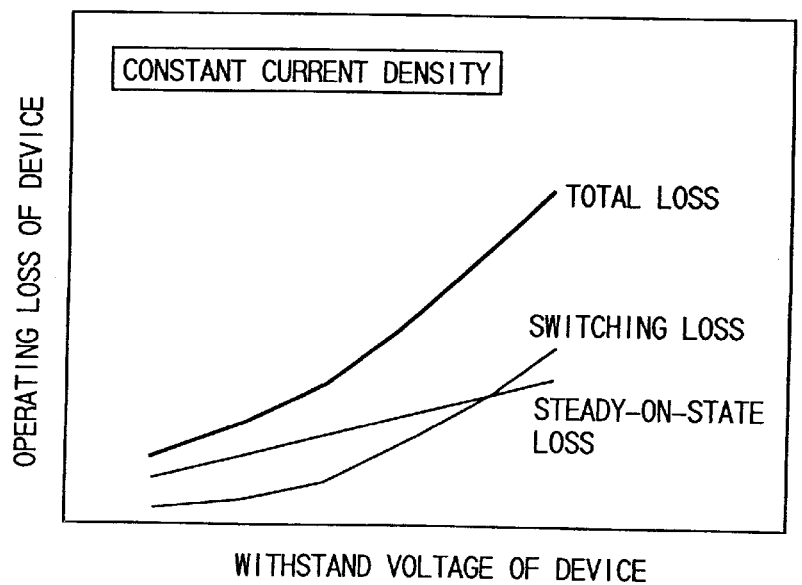
FIG. 8 is a graph showing a relationship between the loss and the withstand voltage of a semiconductor device.

Referring to FIG. 7, A to G indicate directions of current flow. The current flowing through the path A from the load 10 is switched, upon turning off of the GTO 42, to the path B and it charges the snubber capacitor 92. While the snubber capacitor 92 is charged up to a voltage above the voltage of the DC power source 1, the charge on the snubber capacitor 91 is discharged through the path C. When the discharging of the snubber capacitor 91 is ended, the current flow is shifted to the path D and eventually shifted to the path E.

Through such operations in the circuits, two resonant oscillations occur. The first one takes place in the paths F and G after the current flow through the path B is ended. When the current flow through the path B is ended, a recovery current opposite to that flowing through the snubber diode 72 up to that time comes to flow through it and, by this recovery current, energy is stored in the snubber wiring inductance 82. This energy can only be consumed in the snubber diode 72 and, therefore, there is a risk that it is impressed as an overvoltage on the snubber diode 72 and breaks it down. Even if the snubber diode 72 does not break down, a resonance oscillation is produced due to the parasitic capacitance of the snubber diode 72 and the snubber wiring inductance 82. The oscillating frequency is as high as several MHz and causes a great voltage difference. Such a voltage difference becomes a source of noise for the controlling portion of the power converting apparatus causing a malfunction of the apparatus.

Such an oscillating voltage can be suppressed by connecting, in parallel with the snubber diodes (71 to 74) of FIG. 3, the avalanche diodes (141 to 144) whose breakdown voltage is lower than the withstand voltage of the snubber diode. That is, when the voltage generated by the energy stored in the snubber wiring inductance 82 and impressed on the snubber diode 72 exceeds the breakdown voltage of the avalanche diodes (141 to 144), the impressed voltage is clamped thereby. Since, at the same time, the energy is consumed therein, the resonant oscillation is suppressed.

When an avalanche diode made of silicon is used, the device becomes larger and it becomes inevitable that the wiring inductance by its mounting becomes greater. Therefore, sometimes, the effect of suppressing the oscillational voltage is greatly lessened. The avalanche diodes (141 to 144) in the embodiment of FIG. 3 are fabricated by using a substrate made of a semiconductor material having a wider band gap characteristic than that of silicon. Therefore, it is possible to reduce the chip area to approximately below $\frac{1}{10}$ of that of the snubber diodes (71 to 74) and to dispose it in the close vicinity of the snubber diodes (71 to 74).

The second resonant oscillation takes place in the paths H and I after the current flow through the path C is ended. While the current flow through the path C is ended by the discharging of the charge on the snubber capacitor 91, current is flowing at this point of time through the snubber wiring inductance 81. Therefore, for putting out the energy, current continues to flow through the path C and, thereby, the snubber capacitor 91 is charged so as to obtain an opposite polarity from what it had been until then. That is, the snubber capacitor 91 is reversely charged with an electric charge corresponding to the energy which was stored in the wiring inductance 81. Then, the energy is returned to the wiring inductance 81 through the path I. Thus, oscillating currents cyclically flow through the paths I and H. The current at the beginning of the oscillation is virtually as large as the load current and this causes an increase in the losses in the GTO 41, flywheel diode 51, and the snubber diode 71.

When a diode 151 is connected in parallel with the snubber capacitor 91, as shown in FIG. 4, such oscillating currents are suppressed. In FIG. 4, the energy which was stored in the snubber wiring inductance 81 is recovered by the recovery circuit 121 through the diode 151 and through the path C. Thereby, while the oscillating current is suppressed, the losses in the GTO 41, flywheel diode 51, and the snubber diode 71 can be prevented from increasing.

Also, here, the mounting of the diodes (151 to 154) connected in parallel with the snubber capacitors (91 to 94) has great significance, because if the wiring inductance of the diode 151 becomes large, its effect of suppressing the oscillational current is greatly lessened. It is advantageous to make the size of the device smaller and the cooling of it easier in decreasing the wiring inductance. Therefore, it is preferred, also in this case, to use a diode having a substrate made of a semiconductor material having a wider band gap characteristic than that of silicon.

Having described the invention as related mainly to various examples of application to inverters used as power converting apparatuses, it is apparent that the invention also produces the same effect when it is applied to the suppression of the overshoot voltage accompanying the switching operation in converters.

According to the invention, as described above in detail, an overvoltage or oscillational voltage impressed on the semiconductor devices used in a power converting apparatus can be suppressed. Therefore, it becomes possible to provide high output and highly reliable power converting apparatuses. Further, since losses in the semiconductor devices are reduced, the converting efficiency of the power converting apparatuses can be improved.

What is claimed is:

1. A power converting apparatus comprising:
a circuit including at least one semiconductor switch;
a pair of DC terminals electrically connected to said semiconductor switch; and
a flywheel diode connected in a reverse direction and in parallel with said semiconductor switch;
wherein a clamping circuit is connected in parallel with said semiconductor switch, said clamping circuit including at least a diode connected in a reverse direction and in parallel with said semiconductor switch, said diode having a semiconductor substrate with a wider band gap than silicon, and the voltage impressed on said semiconductor switch is clamped at a voltage value higher than the voltage between said DC terminals and lower than the withstand voltage of said semiconductor switch, whereby the voltage impressed on said semiconductor switch is clamped at the breakdown voltage of said diode when said semiconductor switch turns off.

2. A power converting apparatus according to claim 1, wherein the withstand voltage of said semiconductor switch is over 1.5 times and under 2 times the voltage between said DC terminals.

3. A power converting apparatus according to claim 1, wherein said diode is an avalanche diode.

4. A power converting apparatus according to claim 1, wherein said semiconductor substrate is made of silicon carbide.

5. A power converting apparatus according to claim 1, wherein and the wafer area of said diode is less than 1/10 of that of said flywheel diode.

6. A power converting apparatus according to claim 1, wherein and the outer size of said diode is less than ½ of that of said flywheel diode.

7. A power converting apparatus comprising:
a group of semiconductor switches; and
a pair of DC terminals electrically connected to said group of semiconductor switches;
wherein a clamping circuit is connected between said DC terminals, said clamping circuit including at least one diode connected between said DC terminals in a reverse direction of at least one semiconductor switch of said groups of semiconductor switches, said diode having a semiconductor substrate with a wider band gap than silicon, and the voltage impressed on said at least one semiconductor switch is clamped at a voltage value higher than the voltage between said DC terminals and lower than the withstand voltage of said at least one semiconductor switch, whereby the voltage impressed on said at least one semiconductor switch is clamped at the breakdown voltage of said diode when said at least one semiconductor switch turns off.

8. A power converting apparatus according to claim 7, wherein the withstand voltage of said at least one semiconductor switch is over 1.5 times and under 2 times of the voltage between said DC terminals.

9. A power converting apparatus according to claim 7, wherein said diode is an avalanche diode.

10. A power converting apparatus according to claim 7, wherein said semiconductor substrate is made of silicon carbide.

11. A power converting apparatus comprising:
a semiconductor switch; and
a snubber circuit, which is formed of a first diode and a capacitor connected in series, said snubber circuit being connected in parallel with said semiconductor switch;
wherein a second diode, which has a breakdown voltage lower than the withstand voltage of said first diode and has a semiconductor substrate whose band gap is wider than silicon, is connected in parallel with said first diode, and the parallel connecting of said second diode and said first diode is connected to said capacitor in series.

12. A power converting apparatus according to claim 11, wherein the wafer area of said second diode having a semiconductor substrate whose band gap is wider than silicon is less than 1/10 of that of said first diode.

13. A power converting apparatus according to claim 11, wherein the outer size of said second diode having a semiconductor substrate whose band gap is wider than silicon is less than ½ of that of said first diode.

14. A power converting apparatus according to claim 11, wherein said semiconductor substrate is made of silicon carbide.

15. A power converting apparatus comprising:

a semiconductor switch; and a snubber circuit, which is formed of a first diode and a capacitor connected in series, said snubber circuit being connected in parallel with said semiconductor switch;

wherein a second diode having a semiconductor substrate whose band gap is wider than silicon is connected in parallel with said capacitor, and the parallel connecting of said second diode and said capacitor is connected to said first diode in series.

16. A power converting apparatus according to claim 15, wherein said semiconductor substrate is made of silicon carbide.

17. A power converting apparatus according to claim 1, wherein said circuit includes a plurality of said semiconductor switches, and further comprising a plurality of said clamping circuits, a respective one of said plurality of said clamping circuits being connected in parallel with a respective one of said plurality of said semiconductor switches.

18. A power converting apparatus according to claim 7, wherein a plurality of said clamping circuits is provided, a respective one of said plurality of clamping circuits including said at least one diode connected between said DC terminals in the reverse direction of a respective one of said group of semiconductor switches.

* * * * *